(12) United States Patent
Yamada et al.

(10) Patent No.: US 7,432,591 B1
(45) Date of Patent: Oct. 7, 2008

(54) THERMAL ENHANCED PLASTIC BALL GRID ARRAY WITH HEAT SINK ATTACHMENT OPTION

(75) Inventors: Yasuharu Yamada, Shiga (JP); Tsutomu Nakae, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/039,555

(22) Filed: Feb. 28, 2008

(51) Int. Cl.
*H01L 21/00* (2006.01)

(52) U.S. Cl. .................. 257/705; 257/706; 257/707

(58) Field of Classification Search .......... 257/705–707
See application file for complete search history.

(56) References Cited

U.S. PATENT DOCUMENTS

| | | | |
|---|---|---|---|
| 5,969,950 | A | 10/1999 | Tantoush |
| 6,219,238 | B1 | 4/2001 | Andros et al. |
| 6,483,708 | B2 | 11/2002 | Ali et al. |
| 6,751,099 | B2 | 6/2004 | Vrtis et al. |
| 6,756,669 | B2 | 6/2004 | Houle et al. |
| 6,879,039 | B2 * | 4/2005 | Khan et al. .................. 257/730 |
| 6,882,535 | B2 | 4/2005 | Labanok et al. |
| 6,906,414 | B2 * | 6/2005 | Zhao et al. .................. 257/707 |
| 6,989,593 | B2 * | 1/2006 | Khan et al. .................. 257/707 |
| 7,005,737 | B2 * | 2/2006 | Zhao et al. .................. 257/707 |
| 7,038,312 | B2 * | 5/2006 | Khan et al. .................. 257/713 |
| 7,102,225 | B2 * | 9/2006 | Khan et al. .................. 257/706 |
| 7,132,744 | B2 * | 11/2006 | Zhao et al. .................. 257/706 |
| 7,161,239 | B2 * | 1/2007 | Zhao et al. .................. 257/707 |
| 7,170,165 | B2 | 1/2007 | Berto et al. |
| 7,202,559 | B2 * | 4/2007 | Zhao et al. .................. 257/707 |
| 7,219,421 | B2 | 5/2007 | Vrtis et al. |
| 7,227,256 | B2 * | 6/2007 | Zhao et al. .................. 257/707 |
| 2002/0079562 | A1 * | 6/2002 | Zhao et al. .................. 257/678 |
| 2002/0079572 | A1 * | 6/2002 | Khan et al. .................. 257/707 |
| 2002/0185720 | A1 * | 12/2002 | Khan et al. .................. 257/678 |
| 2002/0185722 | A1 * | 12/2002 | Zhao et al. .................. 257/684 |
| 2002/0185734 | A1 * | 12/2002 | Zhao et al. .................. 257/737 |
| 2002/0185750 | A1 * | 12/2002 | Khan et al. .................. 257/780 |
| 2002/0190361 | A1 * | 12/2002 | Zhao et al. .................. 257/678 |
| 2002/0190362 | A1 * | 12/2002 | Khan et al. .................. 257/678 |
| 2003/0057550 | A1 * | 3/2003 | Zhao et al. .................. 257/734 |
| 2003/0111726 | A1 * | 6/2003 | Khan et al. .................. 257/730 |
| 2004/0212051 | A1 * | 10/2004 | Zhao et al. .................. 257/672 |
| 2005/0029657 | A1 * | 2/2005 | Khan et al. .................. 257/738 |
| 2005/0127501 | A1 * | 6/2005 | Khan et al. .................. 257/706 |

(Continued)

*Primary Examiner*—Laura M Schillinger
(74) *Attorney, Agent, or Firm*—Patent Analysis Research Tech Sys. LLC; George L. Walton

(57) ABSTRACT

A thermal enhanced structure comprising a packaged electronic device and a heat sink that is removably attached thereto. The thermal enhanced structure includes a plastic ball grid array (PGBA) with an electronic chip, a plastic mold cover, and a heat spreader with a plurality of spaced apart securing studs positioned and caulked at a periphery edge thereof. The mold cover, the heat spreader and studs are molded and embedded with one another to form a single unit with improved torque strength and heat dissipation. The single molded unit and the plastic ball grid array are secured together by an adhesive material. Then the heat sink can be easily and removably attached to the molded single unit by fastening elements to the molded studs, thereby allowing more efficient controllable forces or pressures to be applied as the mechanical fastening elements are removably attached to the molded studs to thereby prevent stress and damage to the PBGA package.

1 Claim, 2 Drawing Sheets

U.S. PATENT DOCUMENTS

| | | | |
|---|---|---|---|
| 2005/0133905 A1* | 6/2005 | Zhao et al. | 257/706 |
| 2005/0139994 A1* | 6/2005 | Hsu et al. | 257/706 |
| 2006/0065972 A1* | 3/2006 | Khan et al. | 257/712 |
| 2006/0145316 A1* | 7/2006 | Kim et al. | 257/675 |
| 2007/0007644 A1* | 1/2007 | Zhao et al. | 257/707 |
| 2007/0045824 A1* | 3/2007 | Zhao et al. | 257/706 |

* cited by examiner

THERMAL ENHANCED PLASTIC BALL GRID ARRAY WITH HEAT SINK ATTACHMENT OPTION

BACKGROUND OF THE INVENTION

1. Field of the Invention

The invention relates to the assembling of heat sinks, thermal heat spreaders and electronic or integrated circuit device packaging. In particular, the present relates to a structure and method for removably attaching a heat sink to a heat spreader through stud elements disposed on a top surface of a plastic mold cover/lid disposed therebetween for receiving bolts, screws, rivets or other type of fasteners to an electronic laminate package, such as, a BGA (ball grid array) or PBGA (plastic ball grid array) to improve heat dissipation and controllable forces and pressures applied to the electronic laminate package.

2. Description of the Related Art

It is known that there has been rapid development in electronic or integrated circuit package technology and, as a result, the electronic or integrated circuit package components are becoming smaller and circuitry within the electronic package components is becoming increasingly dense. As the circuit density increases heat generation typically increases as well. Thus, heat dissipation is becoming more critical as the technology develops. This technology includes Ball-grid array (BGA) type integrated circuits (ICs), which will be referred to as simply "BGAs". They have an array of solder balls on the bottom of an IC, which provide electrical connection to the IC. Many techniques have been used to try to improve the reliability of BGAs mounted on printed circuit boards (PCB). Other techniques have been used to try to reduce the amount of stress and shock applied to the BGA.

Various techniques may typically be used to remove or dissipate heat generated by an electronic or integrated circuit component, which may also be referred to as an electronic die. These techniques may include passive and active configurations. One passive configuration involves a conductive material in thermal contact with the backside of a packaged die. This conductive material is often a slug, a heat spreader, or an integrated heat spreader (IHS).

One of the primary purposes for a spreader is to spread, or absorb, and dissipate the heat generated by the die, which minimizes concentrated high-heat locations or hot spots within the die. A heat spreader is attached approximate the back side of the electronic die with a thermally conductive material, such as a thermal interface (TIM) disposed therebetween. Typically thermal interface materials may include, for example, thermally conductive gels, grease or solders. Heat spreaders are typically constructed of a thermally conductive material such as aluminum, electrolytically plated copper, copper alloy, or ceramic, among others.

Heat spreaders may be attached to a substrate using solder, sealants, or other types of adhesive materials. In operation, heat is typically conducted from the electronic die through the thermal interface to the heat spreader by heat conduction. A vent hole is known to be formed in a heat spreader (not shown), and may provide pressure relief inside the electronic package. A heat sink may be attached to a top side of a heat spreader, and in operation, heat is transferred from the heat spreader to the heat sink, and convective heat transfer primarily transfers heat from the heat sink to the surrounding air. Heat sinks are typically attached to a spreader by use of an adhesive material, or mechanical attachment devices, for example, bolts, pins, screws, rivets, and other types of mechanical attachment devices.

It is well known to have a BGA package attached to a heat slag. The method of fixing the heat slag to the BGA package is by a heat conductive double-faced tape or thermal conductive bonding agent. A method of fixing the heat slag or the heat sink to a motherboard via a backing or support plate by studs, spacers and/or mechanical attachment devices, such as, bolts, pins, screws, rivets, and other types of mechanical attachment devices generates unwanted stress or forces that causes damage to the BGA or integrated circuit package.

SUMMARY OF THE INVENTION

An electronic package assembly includes a plastic or laminate ball grid array package (PBGA) attached to a first side of a circuit board (not shown), a heat spreader mounted to an upper surface of the PBGA, the heat spreader is embedded in a plastic or molded cover/shield as a single unit, and a heat sink (not shown) directly and removably attached to the single molded cover and heat spreader unit.

The single molded unit having a plurality of spaced securing studs extending upwardly from the upper surface and contiguous to the periphery or edge thereof. The plastic or molded cover/shield is molded about the studs. Such plastic or molded cover/shield is embedded onto the upper surface of the heat spreader to give added strength for screw or mechanical fastening torque. With this arrangement, various types of mechanical fastening devices, such as a screw, pin, rivet, bolt or the like can be utilized to secure the heat sink to the studs. This allows for more efficient controllable forces or pressure to be achieved to prevent stress and damage to the PBGA package. Also, since no motherboard or any other structure is necessary to fix the heat sink thereto, the PGBA components, such as, solder balls receive an effective reduction in the amount of stress and pressure forces applied to overcome damage thereto.

The preferred invention teaches that the studs are secured to the heart spreader by caulking and subjected to plastic molding. However, to one of ordinary skill in the art, it is apparent that many other types of securing means could be utilized, such as, adhesives, soldering, gluing, and various types of mechanical fasteners, if desired.

In order to cope with heat generated in the PBGA package, the molded cover and heat spreader unit enhances or improves the heat dissipation property of the surface of the PBGA package. Since fixed parts are directly attached onto the heat spreader, which is resin-molded in the PBGA package, it is possible to control the height tolerances of the studs; it becomes possible to minimize the distance to a thermal device, such as a heat sink. Therefore, application control of such things as thermal conductive grease becomes easy so that the heat transfer property can be enhanced. Since the structure is simple, a female stud can be tightened into an existing heat spreader, making it possible to produce it in an existing production process.

Moreover, since the thermal device can be directly attached to the molded cover and heat spreader unit, no extra space is required for securing or fixing the thermal unit.

DETAILED DESCRIPTION

Reference will now be made in detail to the preferred embodiments of the invention, examples of which are illustrated in the accompanying drawings. While the invention will be described in conjunction with the accompanying drawings, it will be understood that they are not intended to limit the invention to drawings. On the contrary, the present invention is intended to cover alternatives, modifications and equivalents, which may be included within the spirit and scope of the invention as defined by the appended claims.

Figure 1:
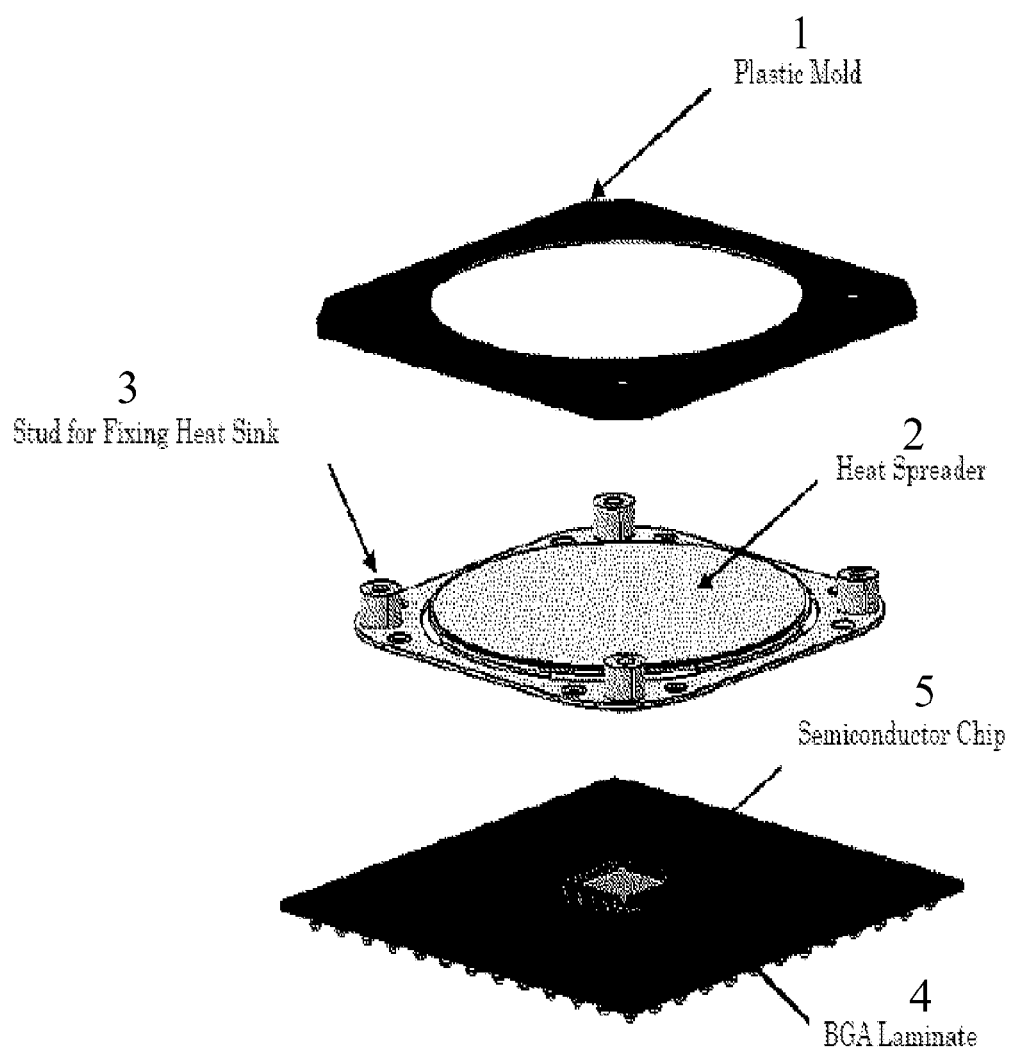
FIG. 1 is an isometric exploded view of the PBGA package according to the present invention.

FIG. 1 is an isometric exploded view of a PBGA package device that includes a plastic mold cover 1, a heat spreader 2 with a plurality of spaced studs 3 disposed on a periphery edge thereof, and a BGA laminate 4 component with a semiconductor chip or electronic component 5 disposed thereon. The laminate 4 shows solder balls or contact elements disposed underneath that are not referenced.

Figure 2:
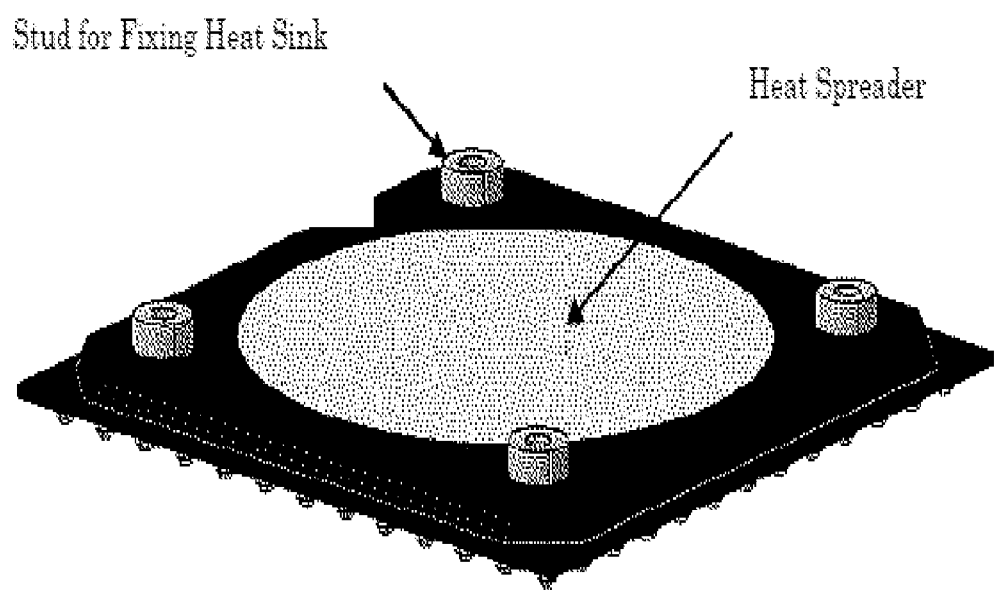
FIG. 2 is a perspective view of the PBGA package according to the present invention.

FIG. 2 shows a perspective view of the PBGA package device. The plastic mold 1 is embedded or molded on the heat spreader 2 and about the studs 3 to form a single unit. The molded single unit is secured to the BGA laminate by an adhesive element not shown. It is preferred that an electrical conductive type of adhesive be utilized, since it can reduce the amount of electrical magnetic emissions generated.

Note that a thermal unit such as a conventional type of heat sink (not shown) can be easily attached and removed from the molded cover and heat spreader unit by mechanical attachment devices, such as, bolts, pins, screws, rivets, and other types of mechanical attachment devices. The mechanical attachment devices are directly secured to the molded studs of the above single unit. When the mechanical attachments are attached to the studs, the single unit structure provides more added strength against screw or mechanical fastening torque. This single unit structure allows for more efficient controllable forces or pressures to be applied as the mechanical fastening device is attached to the molded studs to thereby prevent stress and damage to the PBGA package. Also, since no motherboard or any other fixture, such as a backing, clamping or support plate is utilized to secure the heat sink to the PBGA package, stress or damage to the PGBA package is prevented.

The arrangement of the single molded cover and heat spreader unit enhances or improves the heat dissipation property of the surface of the PBGA package. This arrangement allows for controlling the height tolerances of the studs, and minimizing the distance and space required to attach a heat sink unit to the studs.

In conclusion, since the structure is a simple arrangement, a female stud can be tightened into an existing heat spreader, making it possible to produce it in an existing production process.

The foregoing descriptions of the specific embodiments of FIGS. 1 and 2 have been presented for purposes of illustration and description. They are not intended to be exhaustive or to limit the present invention to the precise forms disclosed, and obviously many modifications and variations are possible in the light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined as set forth in the following claim(s).

What is claimed is:

1. A method of removably attaching a heat sink to a packaged electronic device, such as a plastic ball grid array (PGBA), the method comprising:

providing the plastic ball grid array (PGBA) with an electronic chip;

providing a heat spreader with a plurality of spaced securing studs positioned and caulked at a periphery edge thereof;

providing a plastic mold cover;

molding and embedding the heat spreader and studs with the plastic mold cover as a single unit;

securing the single molded heat spreader and plastic cover unit to the plastic ball grid array by an adhesive material; and removably attaching the heat sink to the molded single unit by fastening elements to the molded studs;

wherein the single molded unit improves the heat dissipation property of the surface of the PBGA package, defines a much stronger structure against screw or mechanical fastening torque, while allowing for more efficient controllable forces or pressures to be applied as the mechanical fastening device is attached to the molded studs to thereby prevent stress and damage to the PBGA package.

* * * * *